(12) United States Patent
Mori et al.

(10) Patent No.: US 6,335,570 B2
(45) Date of Patent: *Jan. 1, 2002

(54) SEMICONDUCTOR DEVICE AND MANUFACTURING METHOD THEREOF

(75) Inventors: Takeshi Mori; Yoshihiko Toyoda; Tetsuo Fukada; Yoshiyuki Kitazawa, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/293,784

(22) Filed: Apr. 20, 1999

(30) Foreign Application Priority Data

May 1, 1998 (JP) ............................................. 10-122289

(51) Int. Cl.$^7$ ............................ H01L 23/48; H01L 23/52
(52) U.S. Cl. ...................... 257/751; 257/758; 257/762; 257/767
(58) Field of Search ................................ 257/751, 752, 257/753, 758, 760, 762, 763, 767, 773; 438/622, 628, 629, 618, 637, 639, 687

(56) References Cited

U.S. PATENT DOCUMENTS 5,821,168 A * 10/1998 Jain ............................ 438/692
5,930,669 A * 7/1999 Uzoh ........................... 438/627
6,002,175 A * 12/1999 Maekawa .................... 257/760

FOREIGN PATENT DOCUMENTS

JP 2000-299293 * 10/2000

OTHER PUBLICATIONS

"Damascene Cu Interconnections Capped by TiWN Layer", T. Fukada et al., Technical Preport Of IEICE. SCM96–169 (1996–12), pp. 85–92.

"Ultra–Low Resistance Direct Contact Cu Via Technology Using In–Situ Chemical Vapor Cleaning", Y. Tsuchiya et al., 1997 Symposium on VLSI Technology Digest of Technical Papers, pp. 59–60.

* cited by examiner

Primary Examiner—Steven Loke
Assistant Examiner—Hung Kim Vu
(74) Attorney, Agent, or Firm—McDermott, Will & Emery

(57) ABSTRACT

A semiconductor device capable of preventing diffusion of a particle of copper or the like which forms a conductive layer is provided without any increase in the number of manufacturing the steps. Further, a semiconductor device preventing diffusion of a particle forming a conductive layer into an insulating layer even when a width of the conductive layer is increased is provided. The semiconductor device includes: an insulating layer 2; a barrier layer 4; a conductive layer 5; a barrier layer 6 having an opening 11; an insulating layer 7 having a through hole 8 exposing a surface of conductive layer 5 and a part of a surface of barrier layer 6; a barrier layer 9 formed on a surface of said through hole 8 and insulating layer 7 which is in contact with an upper surface 6a of barrier layer 6; and a conductive layer 10 filling opening 11 and through hole 8.

5 Claims, 20 Drawing Sheets

SEMICONDUCTOR DEVICE AND MANUFACTURING METHOD THEREOF

BACKGROUND OF THE INVENTION

1. Field of the Invention

The present invention relates to semiconductor devices and manufacturing methods thereof and, more particularly to a semiconductor device having a conductive layer including copper and a manufacturing method thereof.

2. Description of the Background Art

With recent increase in demand for higher integration degree and speed of the semiconductor device, various considerations are given to the material of a conductive layer. If a width of the conductive layer becomes smaller than about 0.15 μm, the selection of materials which can be used for the conductive layer would extremely be limited. Recently, the use of copper for the conductive layer has been described for example in "Damascene Cu interconnection capped by TiWN layer"*TECHNICAL REPORT OF IEICE, SDM* 96-169 (1996-12).

FIG. 29 is a cross sectional view showing a structure of the conductive layer which is described in the aforementioned article. Referring to FIG. 29, a trench 92 is formed in an insulating layer 91 including silicon dioxide and formed on a silicon substrate. A conductive layer 94 including copper is formed in trench 92 with a barrier layer 93 including titanium nitride, tantalum or tantalum nitride in the interposed. A cap layer 96 including titanium tungsten nitride (TiWN) is formed to cover an upper surface of conductive layer 94. Barrier layer 93 and cap layer 96 effectively prevent oxidation of conductive layer 94 and diffusion of copper in conductive layer 94 into insulating layer 91, so that degradation of characteristic such as increase in electrical resistance of conductive layer 94 is effectively prevented.

Conventionally, a so-called dual damascene structure as shown in FIG. 29 in which a multiple of conductive layers including copper are formed is described, for example, in 1997 *Symposium on VLSI Technology Digest of Technical Papers* pp. 59–60. FIGS. 30 to 38 are cross sectional views showing a method of manufacturing the dual damascene structure described in the above mentioned document. Referring to FIG. 30, an insulating layer 101 including silicon dioxide is formed on a silicon substrate, and a trench 102 is formed in insulating layer 101. A first layer including titanium nitride, tantalum or tantalum nitride is formed to cover a surface of trench 102, and a copper layer is formed on the first layer to fill trench 102. The copper and first layers are planarized by CMP (Chemical Mechanical Polishing), so that a barrier layer 103 including titanium nitride, tantalum or tantalum nitride and a conductive layer 104 including copper are formed.

Formed on insulating layer 101 are a barrier layer 105 including silicon nitride, an insulating layer 106 including silicon dioxide, a barrier layer 107 including silicon nitride, an insulating layer 108 including silicon dioxide and a barrier layer 109 including titanium nitride, tantalum or tantalum nitride. By sequentially etching these layers, holes 111 and 110 are formed.

As shown in FIG. 31, when the etching is finished, a particle 112 of carbon fluoride ($CF_x$), a particle 113 of cupric oxide (CuO), a particle 116 of copper fluoride ($CuF_x$) or the like adhere to a sidewall of hole 110. A cupric oxide layer 114 is formed on a surface of conductive layer 104, and a cuprous oxide ($Cu_2O$) layer 115 is formed therebelow. It is noted that barrier layers 103, 105, 107 and 109 as well as insulating layer 108 are not shown in FIGS. 31 to 34.

Referring to FIG. 32, oxygen plasma allows particles 112 and 116 of carbon and copper fluoride to be oxidized and disappeared.

Referring to FIG. 33, an oxide is reduced by hydrofluoric acid (HF). Thus, particle 113 of cupric oxide disappears and, cupric oxide layer 114 in conductive layer 104 is also reduced to form cuprous oxide layer 115.

Referring to FIG. 34, cuprous oxide layer 115 is reduced by gaseous hydrogen to copper.

Referring to FIG. 35, a barrier layer 121 including titanium nitride, tantalum or tantalum nitride is formed to cover side surfaces of holes 110 and 111 and the surface of conductive layer 104.

Referring to FIG. 36, an entire surface of barrier layer 121 is etched back to expose the surface of conductive layer 104.

Referring to FIG. 37, a copper layer 123 is formed by CVD (Chemical Vapor Deposition).

Referring to FIG. 38, an entire surface of the copper layer is etched back by CMP to form a conductive layer 124 including copper. Thus, a dual damascene structure in which conductive layers 104 and 124 are connected is completed.

In the above described method, however, a step of cleaning hole 110 as shown in conjunction with FIGS. 32 to 34 is required after holes 110 and 111 are formed, whereby the number of steps for manufacturing the semiconductor device disadvantageously increases.

Further, if hole 110 is formed with a diameter larger than a width of trench 102 in the step shown in FIG. 30 such that a width of conductive layer 124 filling hole 110 is increased, a surface of insulating layer 101 is exposed by hole 110. If hole 110 is filled with copper layer 123, the copper is oxidized as it is in contact with silicon dioxide, so that electrical resistance of conductive layer 124 increases. In addition, as copper is diffused into insulating layer 101, insulating characteristic of insulating layer 101 is impaired.

SUMMARY OF THE INVENTION

The present invention is made to solve the aforementioned problem. An object of the present invention is to provide a semiconductor device having a conductive layer capable of effectively preventing diffusion of particles of copper or the like which form the conductive layer without any increase in the number of manufacturing steps.

Another object of the present invention is to provide a semiconductor device in which particles of copper or the like forming a conductive layer are not diffused to an insulating layer even when a width of the conductive layer is increased.

A semiconductor device according to the present invention includes a first insulating layer, first diffusion preventing layer, first conductive layer, second diffusion preventing layer, second insulating layer, third diffusion preventing layer and second conductive layer.

The first insulating layer is formed on a semiconductor substrate and has a recess. The first diffusion preventing layer is formed on a surface of the recess. The first conductive layer is formed on a surface of the first diffusion preventing layer to fill the recess. The second diffusion preventing layer is formed on a surface of the first insulating layer and provided with an opening which exposes a surface of the first conductive layer. The second insulating layer is formed on a surface of the second diffusion preventing layer to expose the surface of the first conductive layer and a part of the surface of the second diffusion preventing layer, and has a first hole communicating with the opening. The third diffusion preventing layer is formed on a side surface of the first hole and on the second insulating layer in contact with an upper surface of the second diffusion preventing layer. The second conductive layer fills the opening and the first hole such that it is in contact with the first conductive layer.

In the semiconductor device having the above described structure, a side surface of the opening is formed by the part of the surface of the second diffusion preventing layer, the side surface of the first hole is formed by the third diffusion preventing layer, and the third diffusion preventing layer is in contact with the upper surface of the second diffusion preventing layer. Thus, the portion of the second conductive layer which fills the opening and the first hole is in contact with the second and third diffusion preventing layers, so that the second conductive layer would not be in contact with the insulating layer even if a diameter of the first hole and a width of the first conductive layer are increased. As a result, atoms of the second conductive layer would not be diffused into the insulating layer. In addition, increase in electrical resistance of the second conductive layer is prevented.

Preferably, the diameter of the first hole is larger than that of the opening.

Further, the third diffusion preventing layer preferably includes fourth and fifth diffusion preventing layers which are respectively formed on the side surface of the first hole and on the second insulating layer.

Preferably, the semiconductor device further includes a fourth diffusion preventing layer formed on a portion of the third diffusion preventing layer which is formed on the side surface of the first hole. In this case, as two diffusion preventing layers are formed on the side surface of the first hole, the diffusion of atoms forming the second conductive layer is more effectively be prevented.

More preferably, the semiconductor device further includes a third insulating layer formed on the second insulating layer, where the third insulating layer has a second hole communicating with the first hole and the third diffusion preventing layer is formed on the side surfaces of the first and second holes and on the third insulating layer. In this case, if the second hole is filled with a conductive layer, another conductive layer can be formed.

Preferably, the first and second conductive layers include copper, and the first and second insulating layers include silicon dioxide.

Preferably, the first and third diffusion preventing layers include at least one material selected from a group of titanium nitride, tantalum or tantalum nitride, and the second diffusion preventing layer includes silicon nitride. In this case, as the first and third diffusion preventing layers which are respectively in contact with the first and second conductive layers in a large area include at least one material selected from the group of titanium nitride, tantalum or tantalum nitride, which are all conductors. Thus, electrical resistance of the first and second conductive layers is not increased. Further, as the second diffusion preventing layer formed between the first and second insulating layers includes silicon nitride, which is an insulator, the problem associated with short-circuit is avoided even when the silicon nitride is brought into contact with another conductive layer.

A method of manufacturing a semiconductor device according to the present invention includes the steps of:

forming a first insulating layer having a recess on a semiconductor substrate;

forming a first diffusion preventing layer on a surface of the recess;

forming a first conductive layer on a surface of the first diffusion preventing layer to fill the recess;

forming a second diffusion preventing layer on surfaces of the first conductive and insulating layers;

forming a second insulating layer on a surface of the second diffusion preventing layer;

selectively removing the second insulating layer to form a first hole which exposes a portion of the second diffusion preventing layer;

forming a third diffusion preventing layer on a side surface of the first hole in contact with an upper surface of the second diffusion preventing layer;

removing the exposed portion of second diffusion preventing layer using the second insulating layer and the third diffusion preventing layer as masks to form an opening which communicates with the first hole and exposes a portion of the first conductive layer; and filling the opening and the first hole to form a second conductive layer in contact with the first conductive layer.

In the method of manufacturing the semiconductor device having the above described steps, the third diffusion preventing layer is formed on the sidewall of the first hole when the exposed portion of the second diffusion preventing layer is removed. Thus, for removing the first diffusion preventing layer, even when a particle comes from the first conductive layer therebelow, contact between the particle and the second insulating layer is prevented by the third diffusion preventing layer. As a result, the semiconductor device is provided which has a connection structure capable of effectively preventing diffusion of the particle or the like forming the conductive layer without any step of cleaning the hole which has conventionally been used.

Preferably, the step of forming the third diffusion preventing layer includes forming a third diffusion preventing layer on a surface of the exposed portion of the second diffusion preventing layer, side surface of the first hole and the second insulating layer. The method of manufacturing the semiconductor further includes a step of removing a portion of the third diffusion preventing layer on the surface of the portion of the second diffusion preventing layer to expose the portion of the second diffusion preventing layer.

Preferably, the step of forming the first hole includes forming the first hole having a diameter which is larger than a width of the first conductive layer, and the step of forming the opening includes forming a resist pattern with a hole pattern having a diameter which is equal to or smaller than the width of the first conductive layer on the surface of the second diffusion preventing layer such that a portion of the second diffusion preventing layer on the first conductive layer is exposed and removing the exposed portion of the second diffusion preventing layer using the resist pattern as a mask. In this case, as the first hole having a large diameter is formed, electrical resistance of the second conductive layer which fills the first hole can be reduced. Further, as the portion of the second diffusion preventing layer is removed in accordance with the resist pattern with the hole pattern having a width which is equal to or smaller than the width of the first conductive layer, the diameter of the opening formed in the second diffusion preventing layer would be equal to or smaller than the diameter of the first conductive layer. Thus, the first insulating layer is not exposed and contact between the first and second insulating layers is prevented.

Preferably, the method further includes a step of forming a fourth diffusion preventing layer on a surface of the second insulating layer, and the step of forming the first hole includes forming the first hole by selectively removing the fourth diffusion preventing layer and the second insulating layer.

Preferably, the method further includes a step of forming the fourth diffusion preventing layer on surfaces of the portion of the first conductive layer, third diffusion preventing layer and second insulating layer which have been exposed by removing the second diffusion preventing layer, and the step of forming the second conductive layer includes filling the opening and the first hole to form the second conductive layer which is in contact with the fourth diffusion preventing layer.

In this case, two diffusion preventing layers, that is, the third and fourth diffusion preventing layers, are formed on a sidewall of the first hole.

Preferably, the method further includes a step of forming a third insulating layer on the surface of the second insulating layer and a step of selectively removing the third insulating layer to form a second hole in the third insulating layer. In such manufacturing method, another conductive layer can be formed in the second hole.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described with reference to the drawings.

First Embodiment

Figure 1:
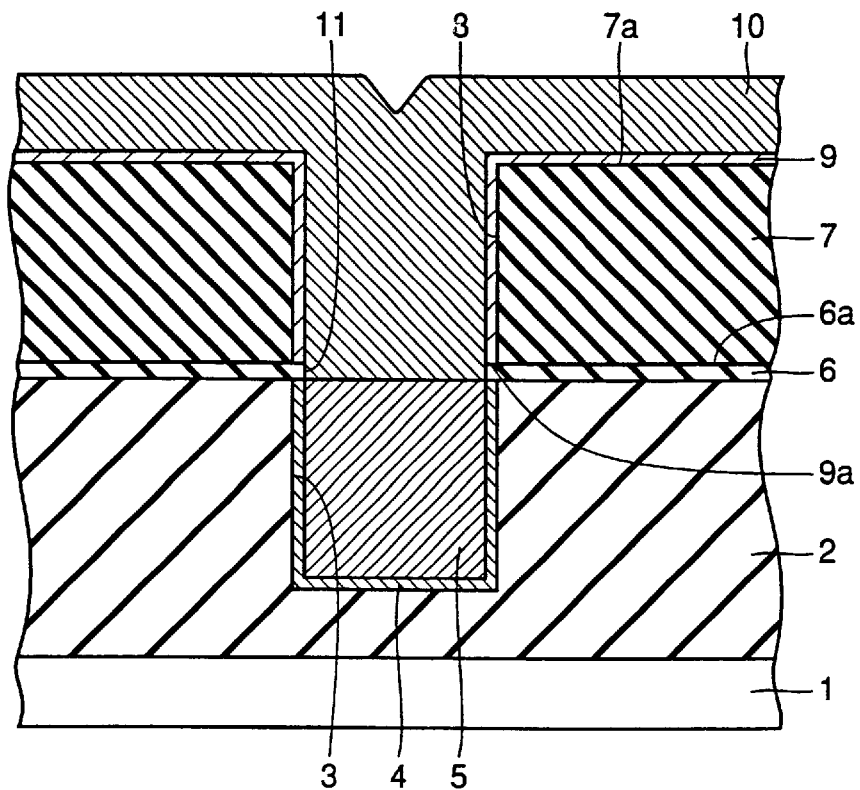
FIG. 1 is a cross sectional view showing a semiconductor device according to a first embodiment of the present invention.

Referring to FIG. 1, in a semiconductor device according to a first embodiment of the present invention, an insulating layer 2 including silicon dioxide ($SiO_2$) is formed as a first insulating layer on a silicon substrate 1 as a semiconductor substrate. A trench 3 having a width of about 0.2 $\mu$m and a depth of about 0.2 $\mu$m is formed in insulating layer 2. A barrier layer 4 having a thickness of about 20 nm and including tantalum nitride is formed as a first diffusion preventing layer to cover a surface of trench 3. A conductive layer 5 including copper is formed to fill trench 3 in contact with barrier layer 4.

A barrier layer 6 having a thickness of 40 nm and including silicon nitride is formed on insulating layer 2 as a second diffusion preventing layer. Barrier layer 6 prevents diffusion of copper into insulating layer 2 and serves as an etching stopper. Barrier layer 6 is provided with an opening 11, which exposes conductive layer 5. A second insulating layer 7 including silicon dioxide is formed on an upper surface 6a of barrier layer 6. Insulating layer 7 is provided with a through hole 8 having a diameter of about 0.2 $\mu$m, which exposes a surface of conductive layer 5 and a side surface of barrier layer 6. A barrier layer 9 is formed on a side surface of through hole 8 as a third diffusion preventing layer. Barrier layer 9 includes tantalum nitride.

A conductive layer 10 is formed as a second conductive layer which fills opening 11 and through hole 8 and is in contact with conductive layer 5 and barrier layer 6. Conductive layer 10 includes copper. An end surface 9a of barrier layer 9 is in contact with upper surface 6a of barrier layer 6.

In the semiconductor device having the above described structure, as the entire portion of conductive layers 5 and 10 are in contact with barrier layers 4, 6 and 9, diffusion of copper of conductive layers 5 and 10 into silicon dioxide of insulating layers 2 and 7 is prevented. Thus, insulating characteristic of insulating layers 2 and 7 would not be impaired. Further, as conductive layers 5 and 10 are not oxidized, electrical resistance of conductive layers 5 and 10 is not increased.

Figure 2:
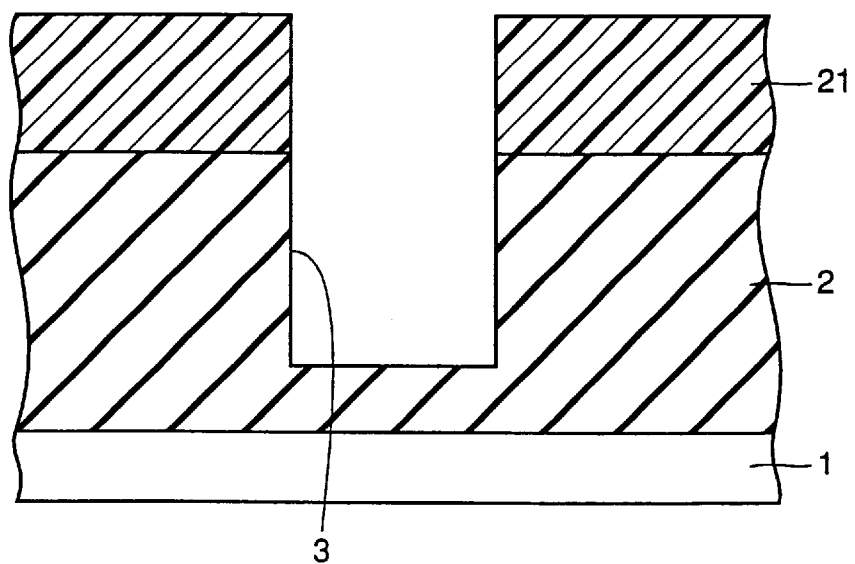
FIGS. 2 to 7 are cross sectional views showing first to sixth steps of a method of manufacturing the semiconductor device shown in FIG. 1.

A method of manufacturing the semiconductor device shown in FIG. 1 will now be described. Referring to FIG. 2, an insulating layer 2 including silicon dioxide is formed by CVD on a silicon substrate 1. A resist pattern 21 having a prescribed pattern is formed on insulating layer. Etching insulating layer 2 in accordance with resist pattern 21 forms a trench 3.

Figure 3:
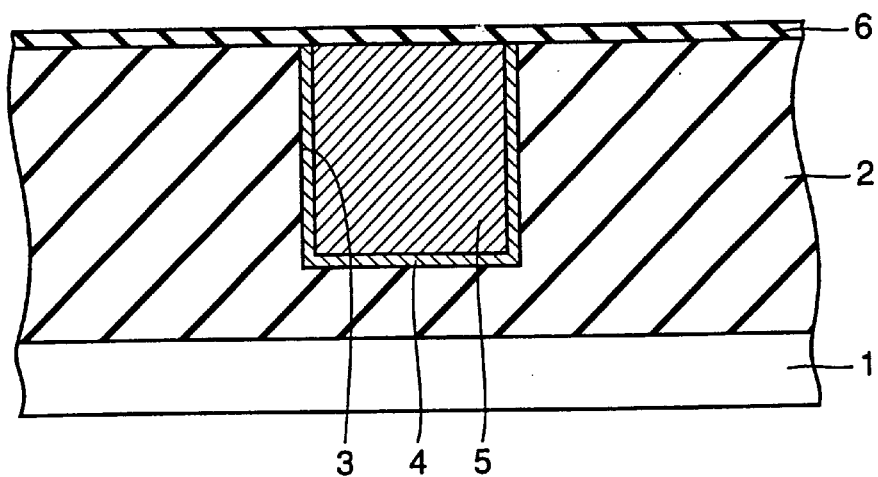

Referring to FIG. 3, a tantalum nitride layer is formed to cover surfaces of trench 3 and insulating layer 2 by CVD. A copper layer is formed on the tantalum nitride layer by CVD. By etching the copper and tantalum nitride layers by CMP, barrier and conductive layers 4 and 5 respectively including tantalum nitride and copper are formed in trench 3. A barrier layer 6 including silicon nitride and having a thickness of about 40 nm is formed by CVD to cover insulating layer 2, barrier layer 4 and conductive layer 5.

Figure 4:
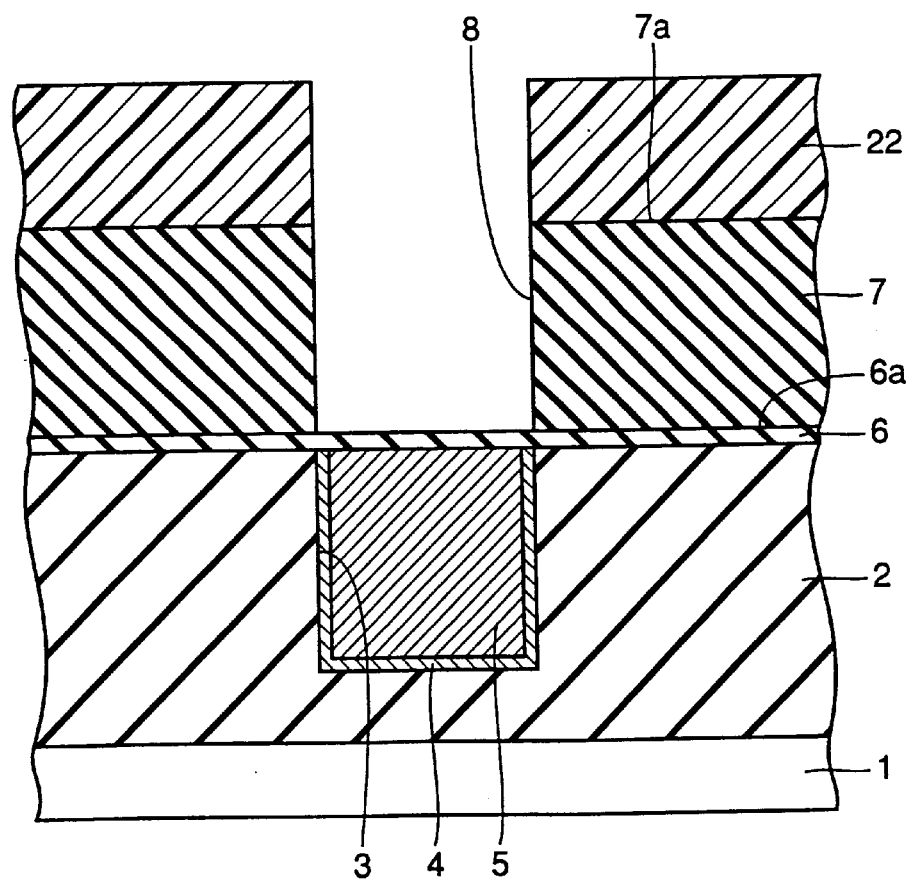

Referring to FIG. 4, an insulating layer 7 including silicon dioxide having a thickness of about 500 nm is formed on barrier layer 6 by CVD. A resist pattern 22 having a prescribed pattern is formed on insulating layer 7. Etching insulating layer 7 in accordance with resist pattern 22 forms a through hole 8.

Figure 5:
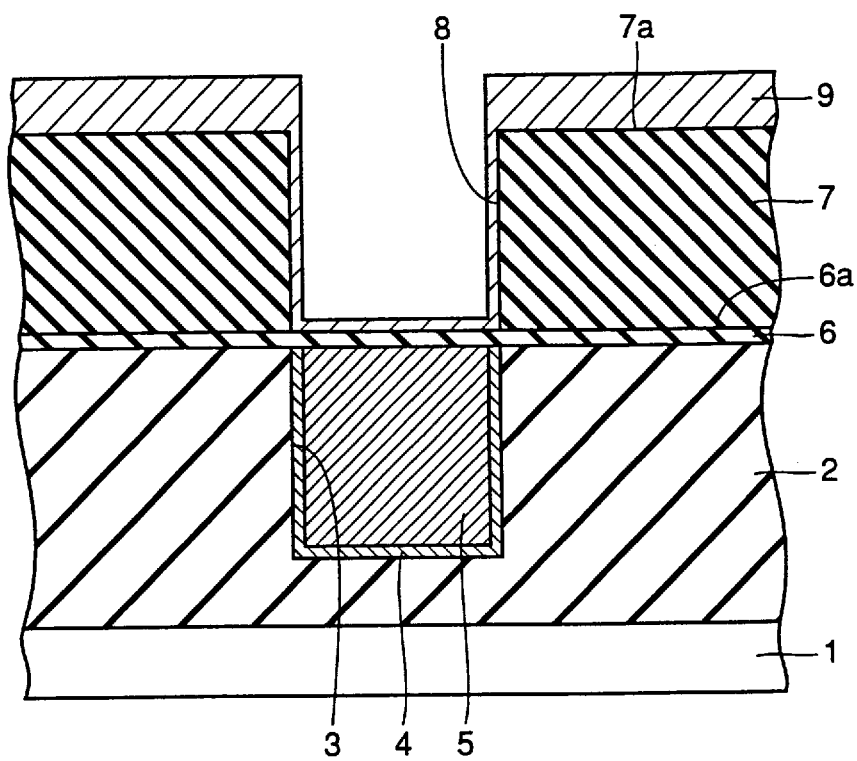

Referring to FIG. 5, a barrier layer 9 including tantalum nitride is formed by sputtering to cover a side surface of through hole 8, barrier layer 6 and an upper surface 7*a* of insulating layer 7. A thickness of the portions of barrier layer 9 which are in contact with the side surface of through hole 8 and barrier layer 6 is about 20 nm, and the portion of barrier layer 9 which is in contact with upper surface 7*a* is about 40 nm.

Figure 6:
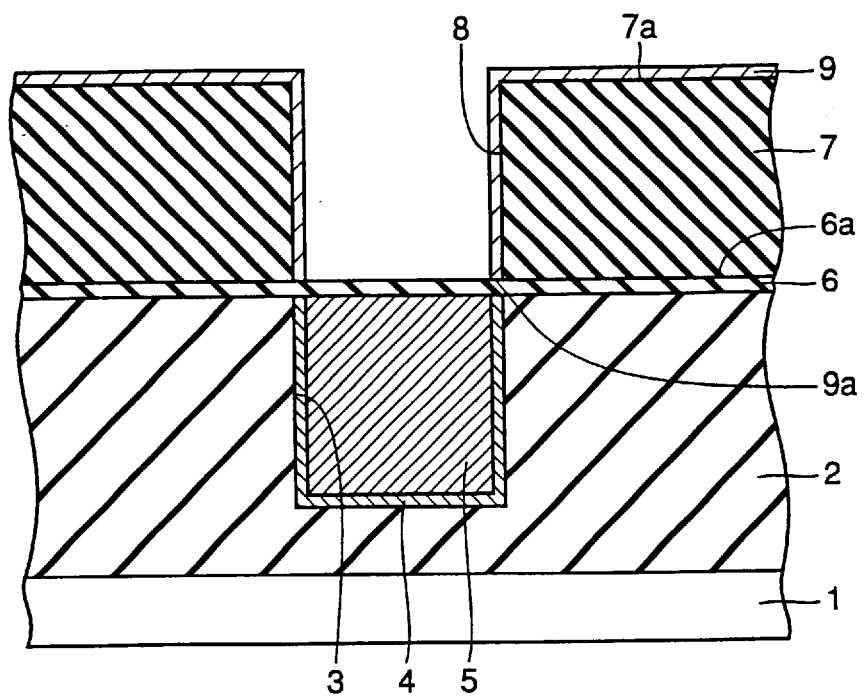

Referring to FIG. 6, an entire surface of barrier layer 9 is etched back by sputter etching using argon. Thus, a portion of barrier layer 6 is exposed. In addition, a thickness of the entire portion of barrier layer 9 becomes about 20 nm.

Figure 7:
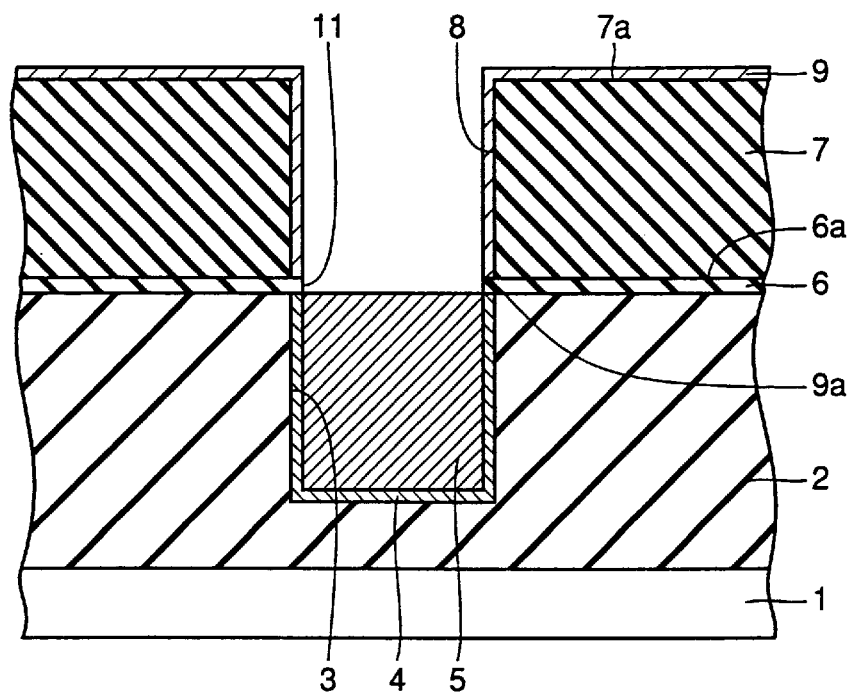

Referring to FIG. 7, barrier layer 6 is etched using CF gas (CF$_x$). Thus, an opening 11 is formed in barrier layer 6, and a surface of conductive layer 5 and a part of a surface of barrier layer 6 are exposed.

Referring to FIG. 1, a conductive layer 10 including copper is formed by CVD to fill opening 11 and through hole 8, so that the semiconductor device shown in FIG. 1 is obtained.

In the above described manufacturing method, barrier layer 9 is formed on a sidewall of through hole 8 when etching barrier layer 6 in the step shown in FIG. 7. Thus, even if copper of conductive layer 5 adheres to barrier layer 9 during etching, the copper would not be diffused into silicon dioxide of insulating layer 10 because of the barrier layer. As a result, the problem associated with insulating characteristic of insulating layer 7 is avoided. In addition, as a conventional step of cleaning the sidewall of through hole 8 is not necessary, the number of steps required for manufacturing the semiconductor device is reduced.

Second Embodiment

Figure 8:
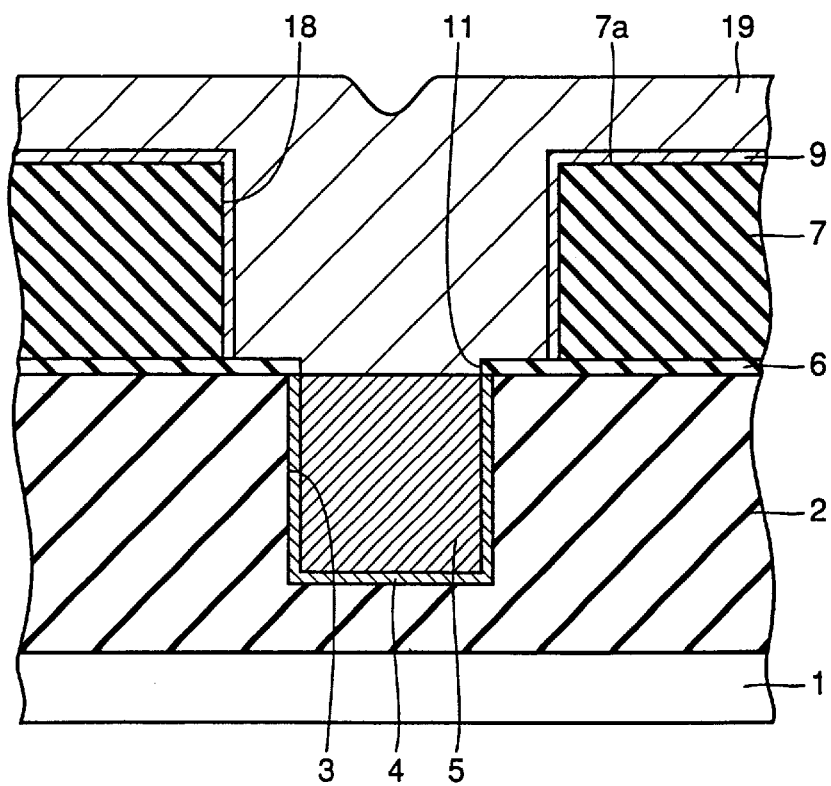
FIG. 8 is a cross sectional view showing a semiconductor device according to a second embodiment of the present invention.

A semiconductor device according to a second embodiment of the present invention shown in FIG. 8 includes a through hole 18 having a diameter of about 0.4 μm. In this respect, it is different from the semiconductor device shown in FIG. 1 which includes through hole 8 having a diameter of about 0.2 μm. Further, a conductive layer 19 including copper is formed to fill through hole 18 in contact with conductive layer 5 as a second conductive layer. Other parts of the structure of the semiconductor device shown in FIG. 8 are similar to those shown in FIG. 1.

The semiconductor device having the above mentioned structure provides a similar effect as the semiconductor device shown in FIG. 1. Further, electrical resistance can be reduced as a width of conductive layer 19 is large. Even if the width of conductive layer 19 is increased, the conductive layer is in contact with barrier layers 6 and 9, but not with insulating layer 7. Thus, diffusion of copper of conductive layer 19 into silicon dioxide of insulating layer 7 is prevented. In addition, conductive layer 19 is not oxidized and electrical resistance of conductive layer 19 is not increased.

Figure 9:
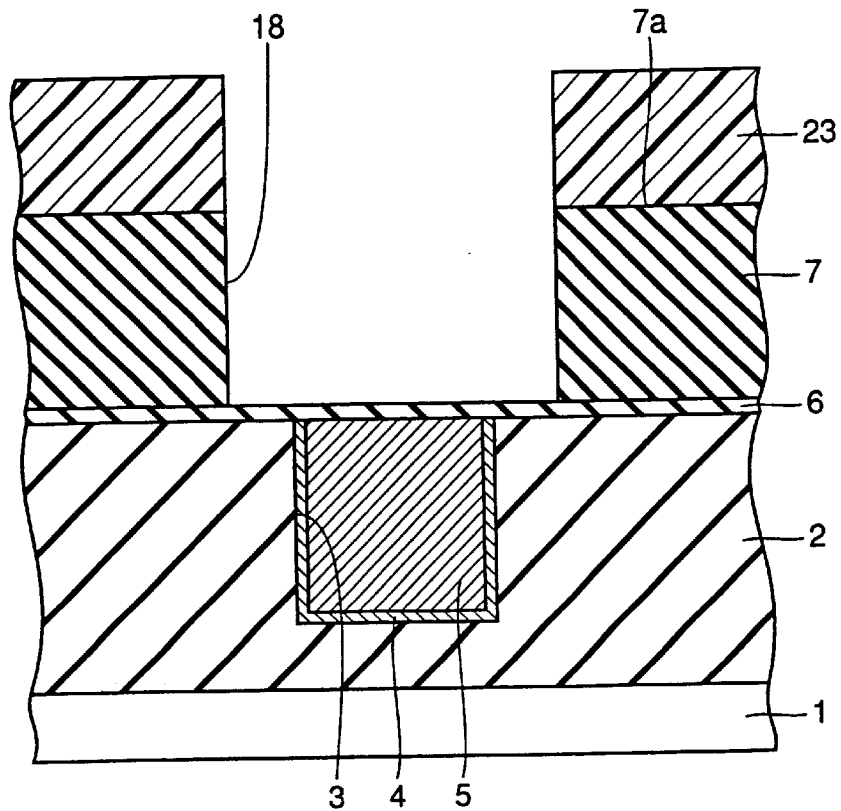
FIGS. 9 to 12 are cross sectional views showing first to fourth steps of a method of manufacturing the semiconductor device shown in FIG. 8.

A method of manufacturing the semiconductor device shown in FIG. 8 will now be described. Referring to FIG. 9, an insulating layer is formed on a silicon substrate 1, and a trench is formed in insulating layer 2, as in the first embodiment. Barrier and conductive layers 4 and 5 are formed in a trench, and a barrier layer 6 is formed to cover insulating layer 2, barrier layer 4 and conductive layer 5. An insulating layer 7 is formed on barrier layer 6. A resist pattern 23 having a prescribed pattern is formed on insulating layer 7. Etching insulating layer 7 in accordance with resist pattern 23 forms a through hole 18 leading to barrier layer 6. A diameter of through hole 18 is about 0.4 μm.

Figure 10:
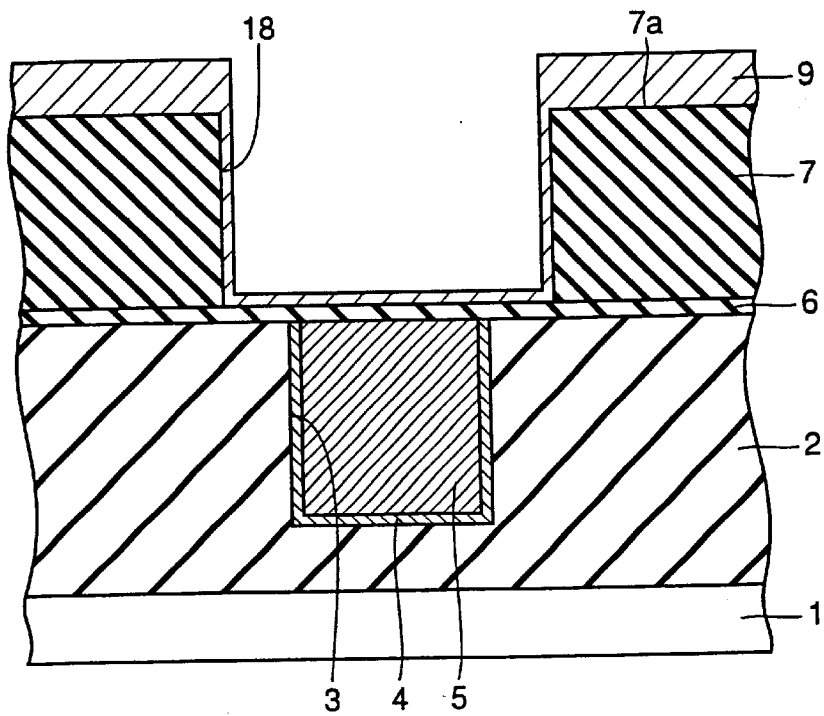

Referring to FIG. 10, a barrier layer 9 including tantalum nitride is formed by sputtering to cover an upper surface 7*a* of insulating layer 7, a side surface of through hole 18 and barrier layer 6. A thickness of the portions of barrier layer 9 which are in contact with barrier layer 6 and the side surface of through hole 18 is about 20 nm, and the thickness of the portion in contact with upper surface 7*a* of insulating layer 7 is about 40 nm.

Figure 11:
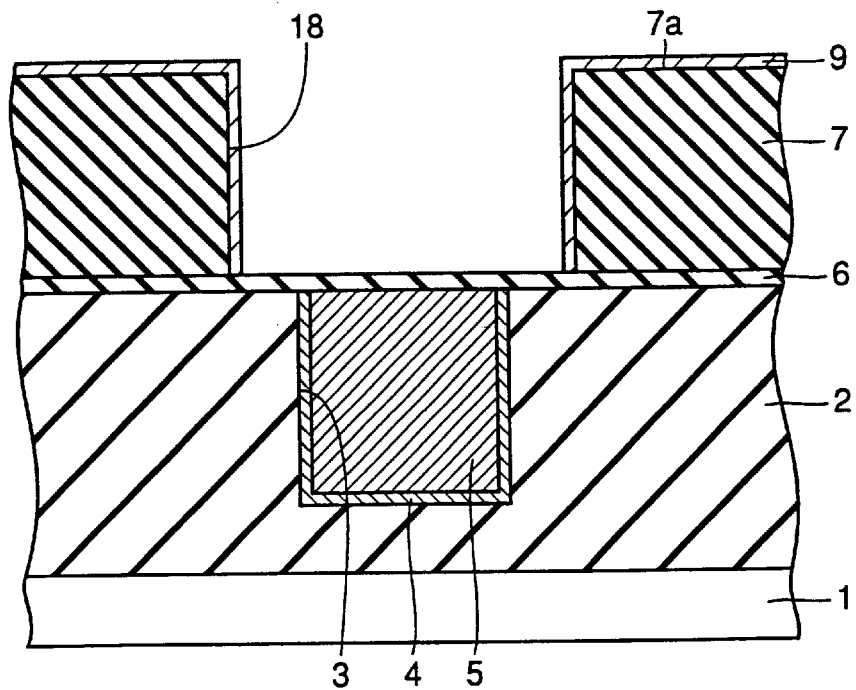

Referring to FIG. 11, an entire surface of barrier layer 9 is etched back by sputter etching using argon to expose a portion of barrier layer 6. A thickness of the entire portion of barrier layer 9 is about 20 nm.

Figure 12:
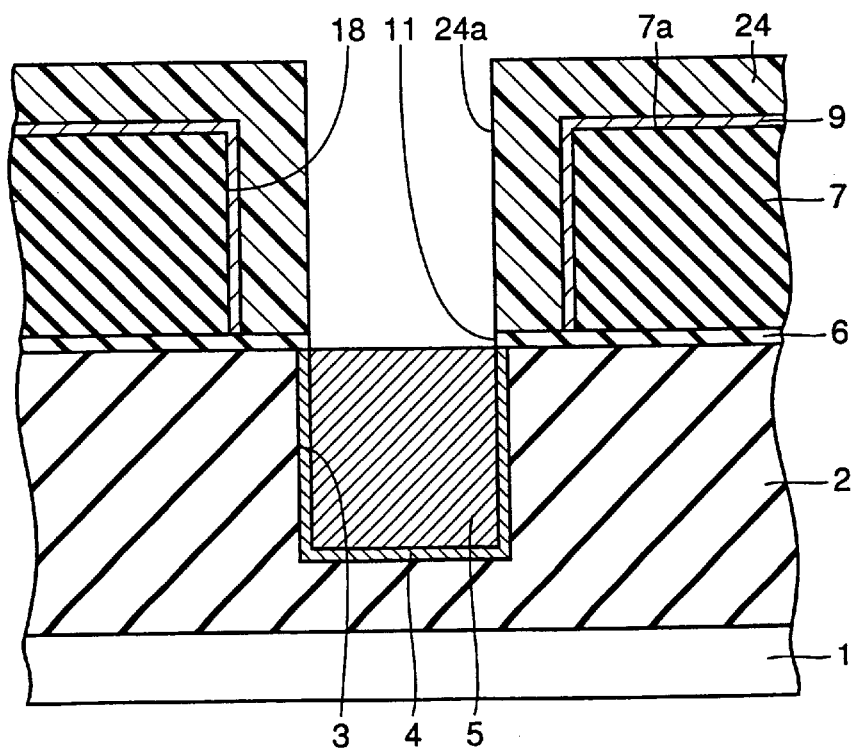

Referring to FIG. 12, a resist pattern 24 having a hole pattern 24*a* with a width of about 0.2 μm is formed to cover barrier layers 6 and 9. Hole pattern 24*a* is above conductive layer 5. Etching barrier layer 6 in accordance with resist pattern 24 by CF gas forms an opening 11 in barrier layer 6.

Referring to FIG. 8, a conductive layer 19 including copper is formed by CVD to fill through hole 18 and opening 11, so that the semiconductor device shown in FIG. 8 is obtained.

In such manufacturing method, even if a particle of copper comes from conductive layer 5 when etching barrier layer 6 in the step shown in FIG. 12, the particle of copper adheres to a side surface of hole pattern 24*a*. Thus, diffusion of copper into silicon dioxide forming insulating layer 7 is prevented, and insulating characteristic of insulating layer 7 is not impaired.

Third Embodiment

Figure 13:
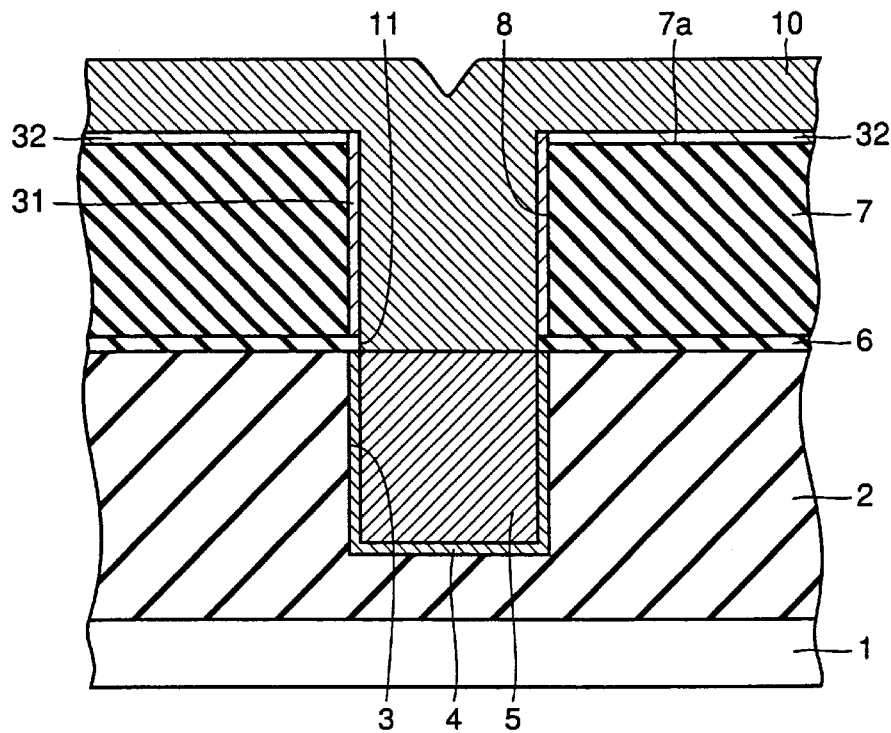
FIG. 13 is a cross sectional view showing a semiconductor device according to a third embodiment of the present invention.

In a semiconductor device according to a third embodiment of the present invention shown in FIG. 13 where a third diffusion preventing layer includes barrier layers 31 and 32 which are formed as fourth and fifth diffusion preventing layers including tantalum nitride having a thickness of about 20 nm in contact with a side surface of a through hole 8 and an upper surface 7*a* of an insulating layer 7, respectively. In this respect, the semiconductor device shown in FIG. 13 is different from that shown in FIG. 1. Other parts of the structure of the semiconductor device in FIG. 13 are similar to those in FIG. 1.

Figure 14:
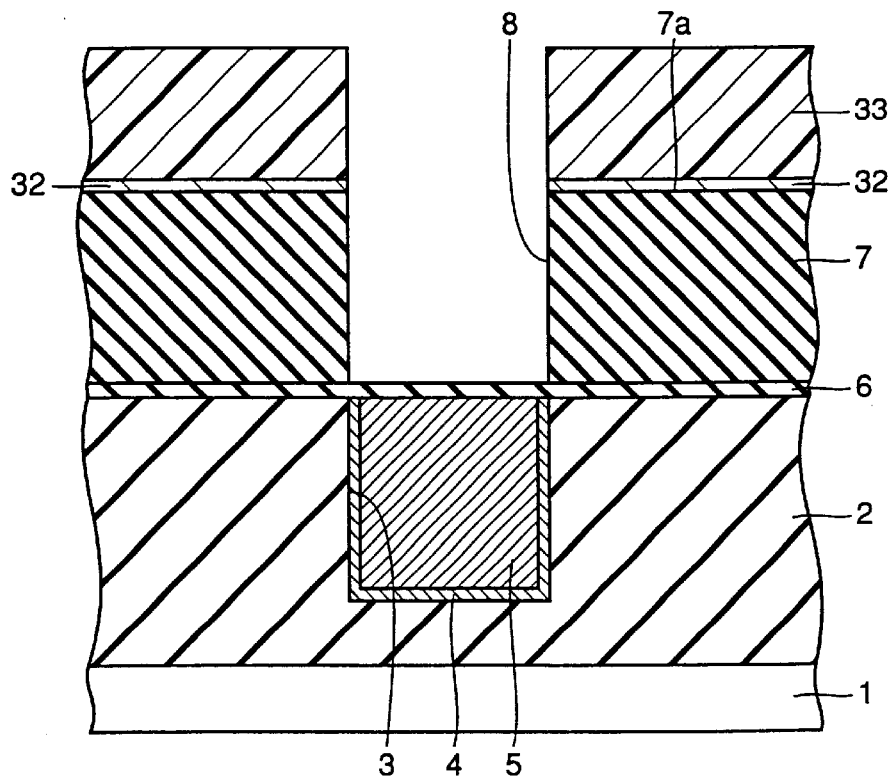
FIGS. 14 to 17 are cross sectional views showing first to fourth steps of a method of manufacturing the semiconductor device shown in FIG. 13.

The semiconductor device having the above mentioned structure provides a similar effect as that shown in FIG. 1. A method of manufacturing the semiconductor device shown in FIG. 13 will now be described. Referring to FIG. 14, an insulating layer 2 is formed on a silicon substrate 1 as in the first embodiment. A trench 3 is formed in insulating layer 2, and barrier and conductive layers 4 and 5 are formed in trench 3. A barrier layer 6 is formed to cover insulating layer 2, barrier layer 4 and conductive layer 5. An insulating layer 7 is formed on barrier layer 6. Barrier layer 32 including tantalum nitride and having a thickness of about 20 nm is formed on insulating layer 7 by sputtering. A resist pattern 33 having a prescribed pattern is formed on barrier layer 32. Etching barrier and insulating layers 32 and 7 in accordance with resist pattern 33 forms a through hole 8 leading to barrier layer 6.

Figure 15:
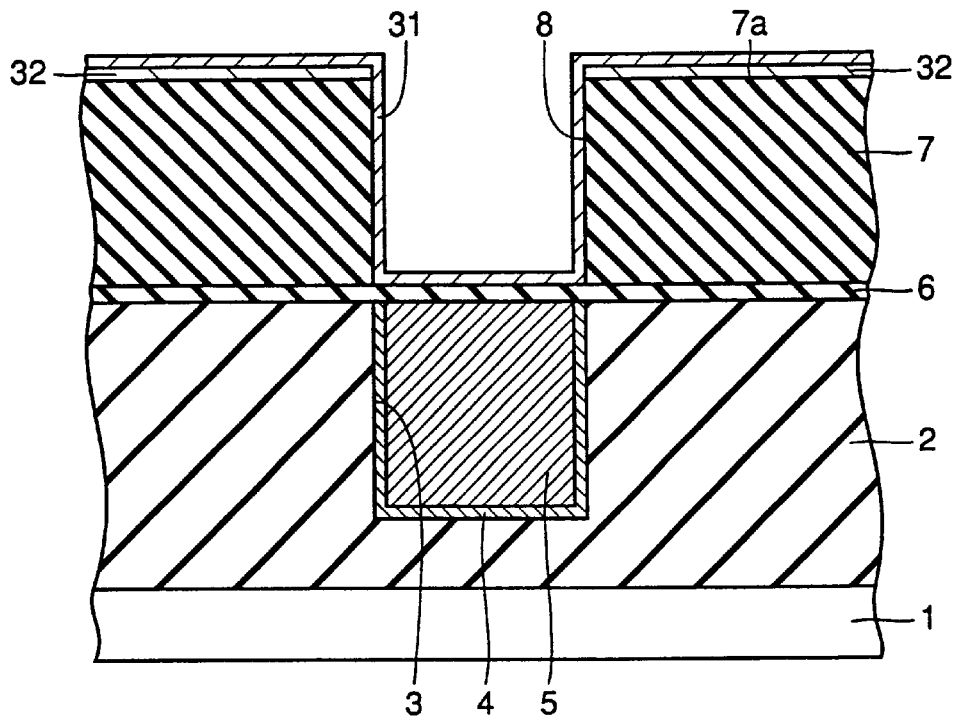

Referring to FIG. 15, a barrier layer 31 including tantalum nitride and having a thickness of about 20 nm is formed by CVD to cover barrier layer 32, a side surface of through hole 8 and barrier layer 6.

Figure 16:
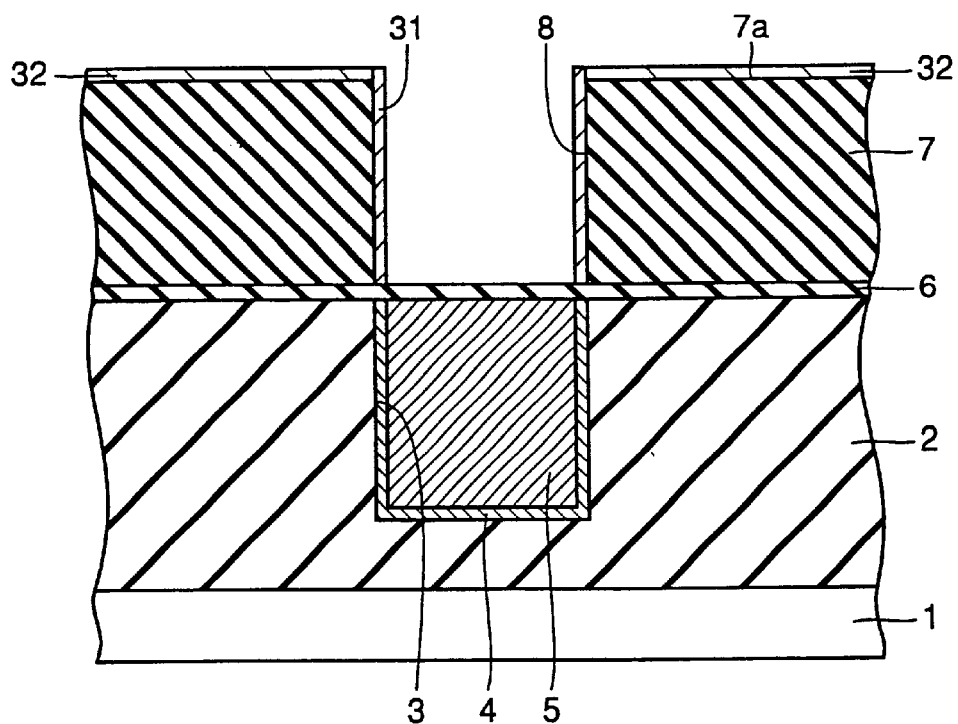

Referring to FIG. 16, sputter etching barrier layer 31 using argon leaves barrier layer 31 only on the side surface of through hole 8, so that barrier layer 6 is exposed and barrier layer 31 on barrier layer 32 is removed.

Figure 17:
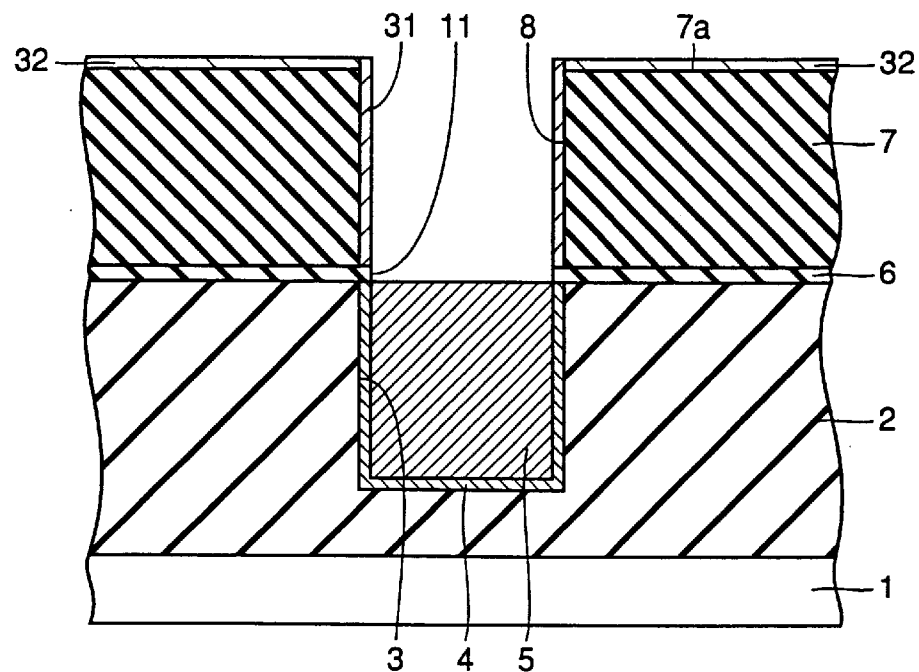

Referring to FIG. 17, barrier layer 61 is etched using CF gas. Thus, an opening 11 is formed in barrier layer 6 and a surface of conductive layer 5 is exposed.

Referring to FIG. 13, a conductive layer 10 including copper is formed by CVD to fill through hole 8. Thus, the semiconductor device shown in FIG. 13 is obtained.

According to the above described manufacturing method, as in the manufacturing method shown in the first embodiment, diffusion of a particle of copper into insulating layer 7 when etching barrier layer 6 is prevented, and insulating characteristic of insulating layer 7 is not impaired.

Fourth Embodiment

Figure 18:
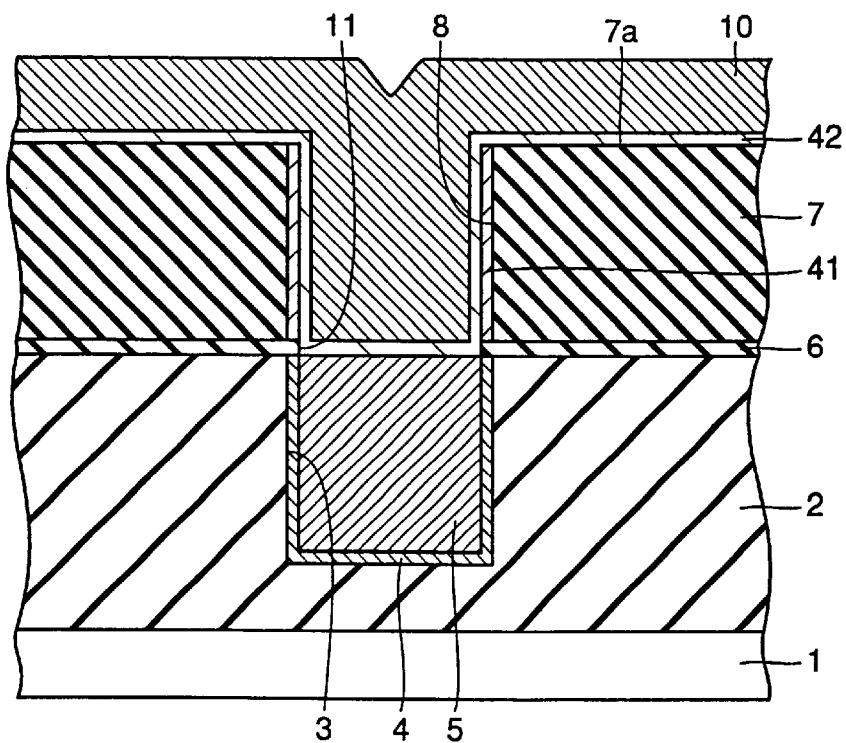
FIG. 18 is a cross sectional view showing a semiconductor device according to a fourth embodiment of the present invention.

In a semiconductor device according to a fourth embodiment of the present invention shown in FIG. 18, two barrier layers, that is, barrier layers 41 and 42, are formed in a through hole 8. In this respect, it is different from the semiconductor device shown in FIG. 1 in which only one barrier layer 9 is formed in through hole 8. Further, in the semiconductor device shown in FIG. 18, a barrier layer 42 including tantalum nitride is formed between conductive layers 10 and 5. In this respect also, it is different from the semiconductor device shown in FIG. 1 in which conductive layers 5 and 10 are directly in contact with each other. Other parts of the structure of the semiconductor device shown in FIG. 18 are similar to those of the semiconductor device shown in FIG. 1.

The semiconductor device having the above mentioned structure provides a similar effect as that of the semiconductor device in FIG. 1. As two barrier layers are formed on the side surface of through hole 8, diffusion of copper of conductive layer 10 filled in through hole 8 into an insulating layer 7 is more effectively prevented.

Figure 19:
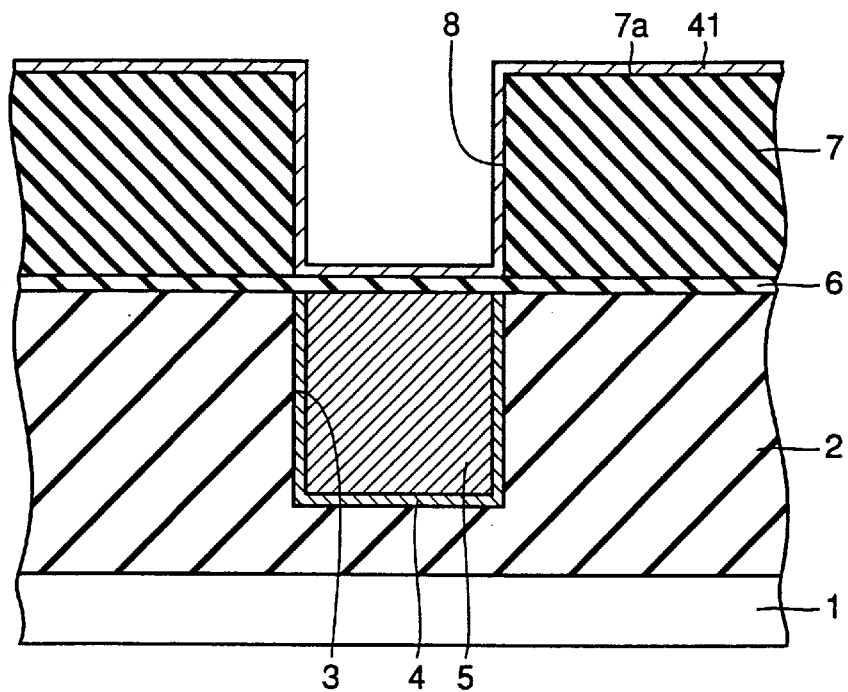
FIGS. 19 to 22 are cross sectional views showing first to fourth steps of a method of manufacturing the semiconductor device shown in FIG. 18.

A method of manufacturing the semiconductor device shown in FIG. 18 will now be described. Referring to FIG. 19, an insulating layer 2 is formed on a silicon substrate 1 as in the first embodiment. A trench 3 is formed in insulating layer 2, and barrier and conductive layers 4 and 5 are formed to cover a surface of trench 3. A barrier layer 6 is formed to cover insulating layer 2, barrier layer 4 and conductive layer 5, and an insulating layer 7 is formed on barrier layer 6. A resist pattern having a prescribed pattern is formed on insulating layer 7. Etching insulating layer 7 in accordance with the resist pattern forms a through hole 8 leading to barrier layer 6. A barrier layer 41 including tantalum nitride having a thickness of about 20 nm is formed by CVD to cover the side surface of through hole 8, an upper surface 7a of insulating layer 7 and barrier layer 6.

Figure 20:
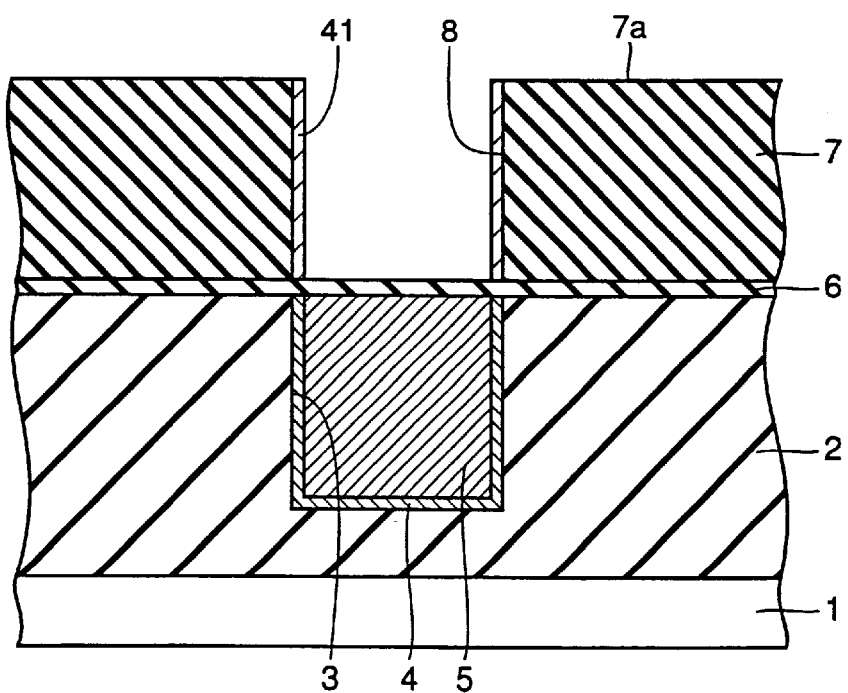

Referring to FIG. 20, an entire surface of barrier layer 41 is etched back by sputter etching using argon. Thus, barrier layer 41 is left only on the side surface of through hole 8, barrier layer 6 is exposed, and barrier layer 41 formed on upper surface 7a of insulating layer 7 is removed.

Figure 21:
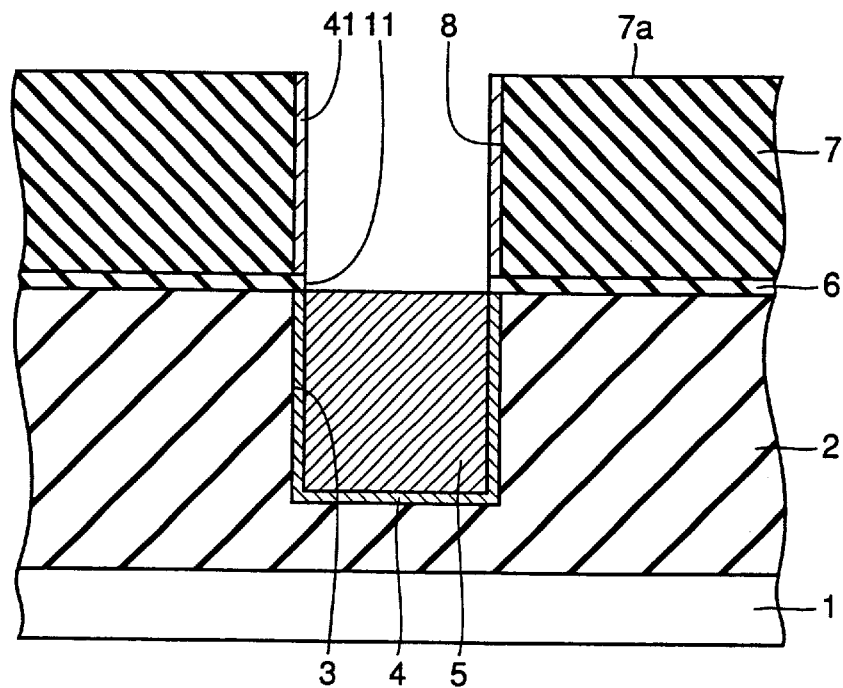

Referring to FIG. 21, barrier layer 6 is etched using CF gas. Thus, an opening 11 is formed and conductive layer 5 is exposed.

Figure 22:
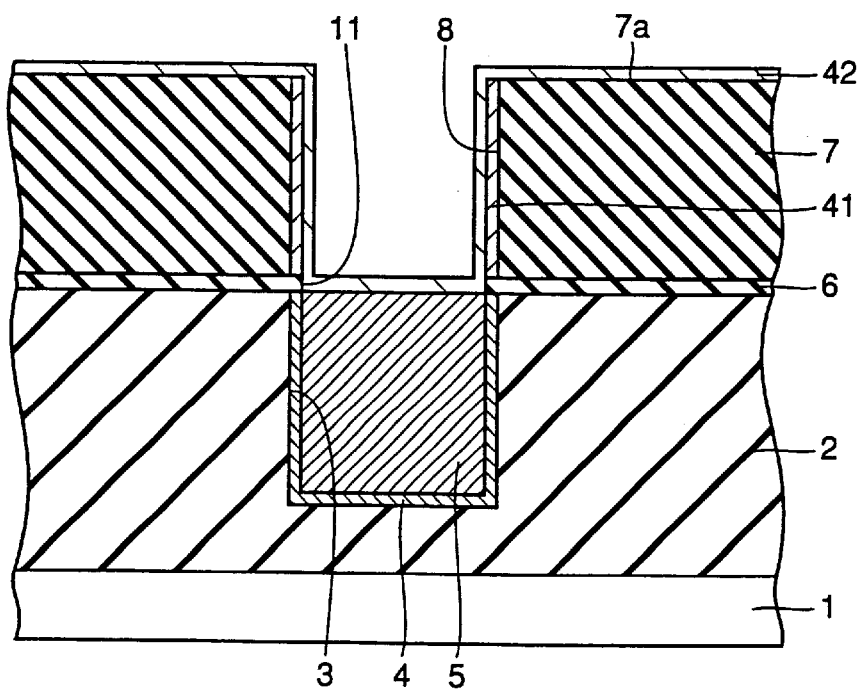

Referring to FIG. 22, a barrier layer 42 including tantalum nitride having a thickness of about 20 nm is formed by CVD to cover barrier layer 41, and upper surface 7a of insulating layer 7.

Referring to FIG. 18, a conductive layer 10 including copper is formed by CVD, so that the semiconductor device shown in FIG. 18 is obtained.

As in the first embodiment, in the above described manufacturing method of the semiconductor device, even if a particle of copper comes from conductive layer 5 when etching barrier layer 6 in the step shown in FIG. 21, diffusion of the particle of copper into insulating layer 7 is prevented by barrier layer 41. Thus, insulating characteristic of insulating layer 7 is not impaired.

Fifth Embodiment

Figure 23:
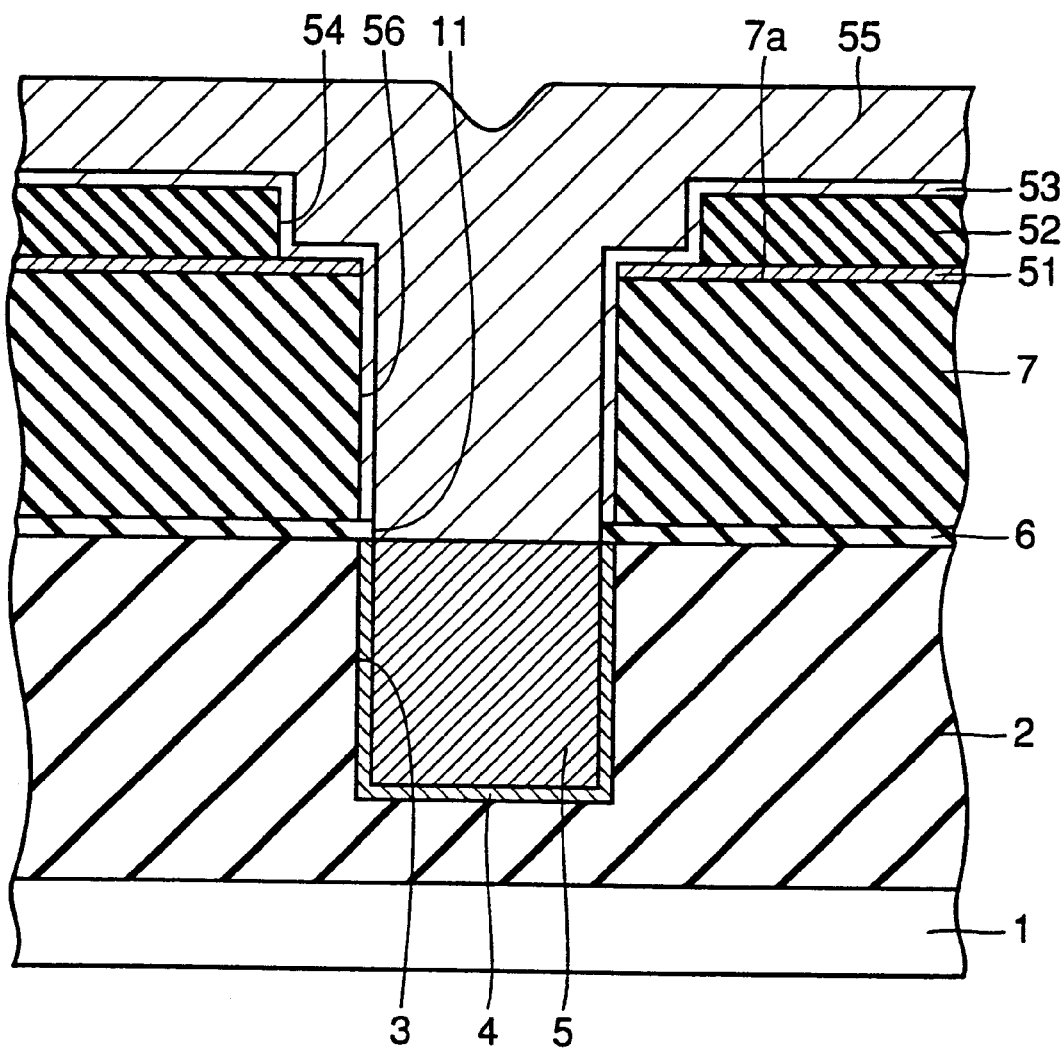
FIG. 23 is a cross sectional view showing a semiconductor device according to a fifth embodiment of the present invention.

In a semiconductor device according to a fifth embodiment of the present invention shown in FIG. 23, an insulating layer 52 is formed on an insulating layer 7 with a barrier layer 51 interposed, and a hole 54 is formed in insulating layer 52. In this respect, the semiconductor device shown in FIG. 23 is different from that shown in FIG. 1. In addition, a through hole 56 is formed to communicate with hole 54, and a barrier layer 53 having a thickness of about 20 nm and including tantalum nitride is formed on side surfaces of hole 54 and through hole 56. A conductive layer 55 including copper is formed to cover through hole 56 and hole 54.

The semiconductor device having the above described structure provides a similar effect as that of the semiconductor device according to the first embodiment. In addition, another conductive layer can be formed in hole 54.

Figure 24:
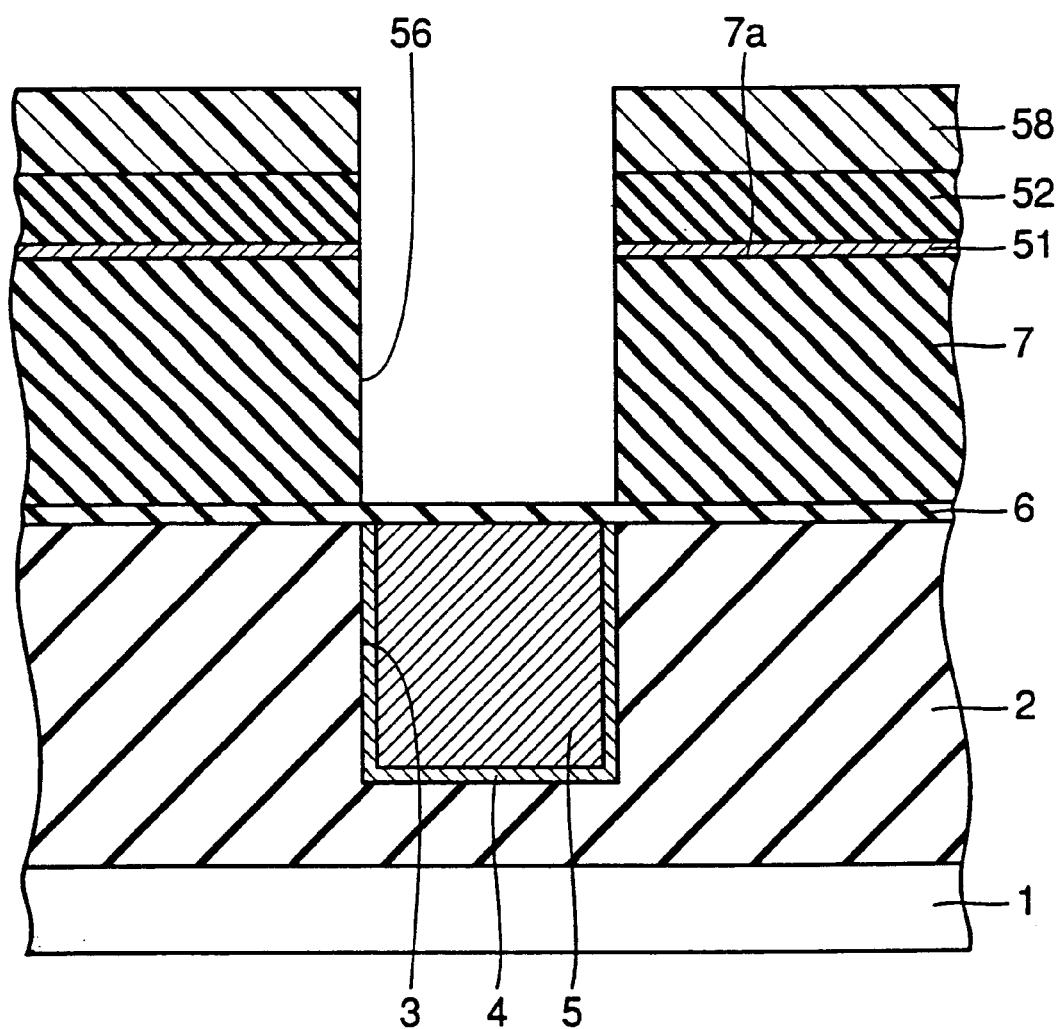
FIGS. 24 to 28 are cross sectional views showing first to fifth steps of a method of manufacturing the semiconductor device shown in FIG. 23.

A method of manufacturing the semiconductor device shown in FIG. 23 will now be described. Referring to FIG. 24, an insulating layer 2 is formed on a silicon substrate 1. A trench 3 is formed in insulating layer 2, and barrier and conductive layers 4 and 5 are formed to cover a surface of trench 3. A barrier layer 6 is formed to cover insulating layer 2, barrier layer 4 and conductive layer 5, on which an insulating layer 7 is further formed. A barrier layer 51 including silicon nitride having a thickness of about 20 nm is formed on insulating layer 7 by CVD. An insulating layer 52 including silicon dioxide having a thickness of about 0.1 μm is formed on barrier layer 51 by CVD. A resist pattern 58 having a prescribed pattern is formed on insulating layer 52. Insulating layer 52, barrier layer 51 and insulating layer 7 are etched in accordance with resist pattern 58. Thus, a through hole 56 is formed which exposes barrier layer 6.

Figure 25:
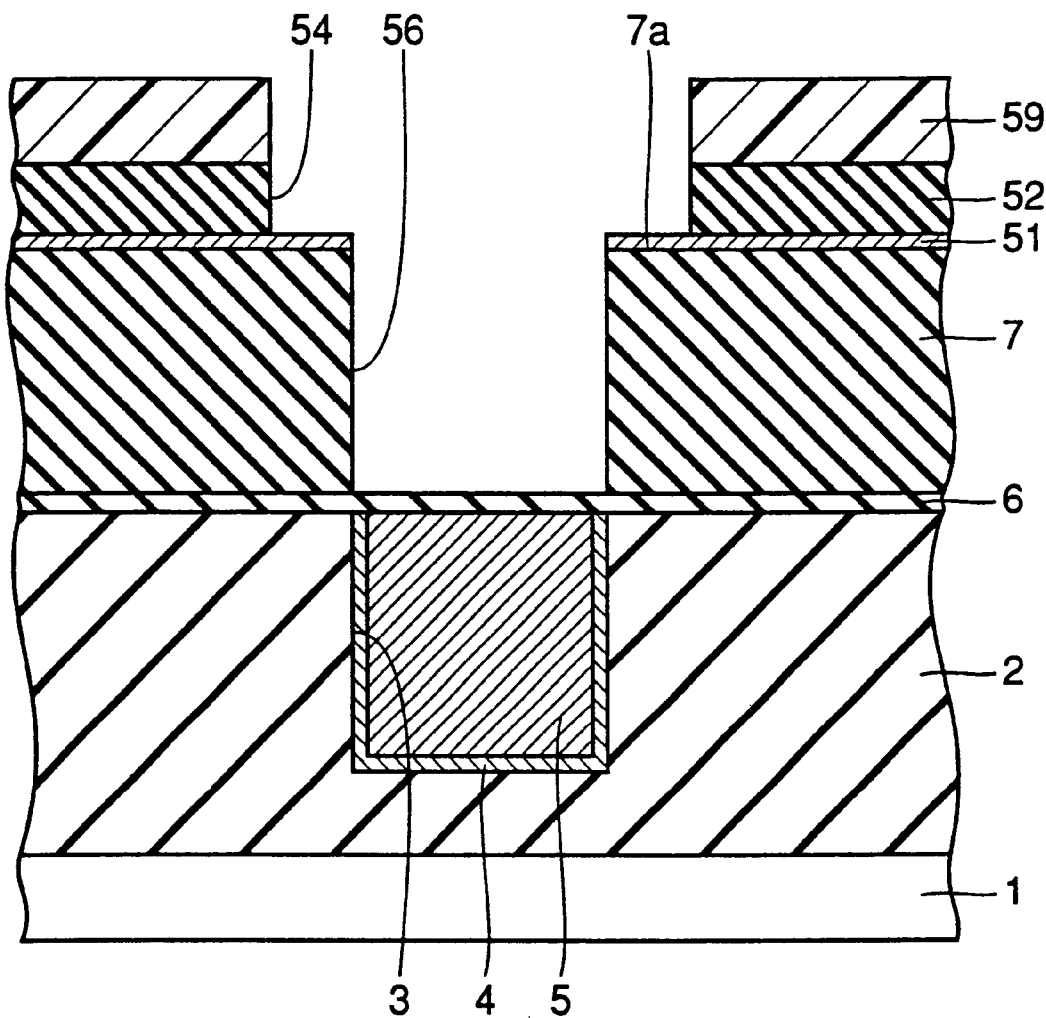

Referring to FIG. 25, a resist pattern 59 having a prescribed pattern is formed on insulating layer 52. Insulating layer 52 is etched in accordance with resist pattern 59. Thus, a hole 54 is formed.

Figure 26:
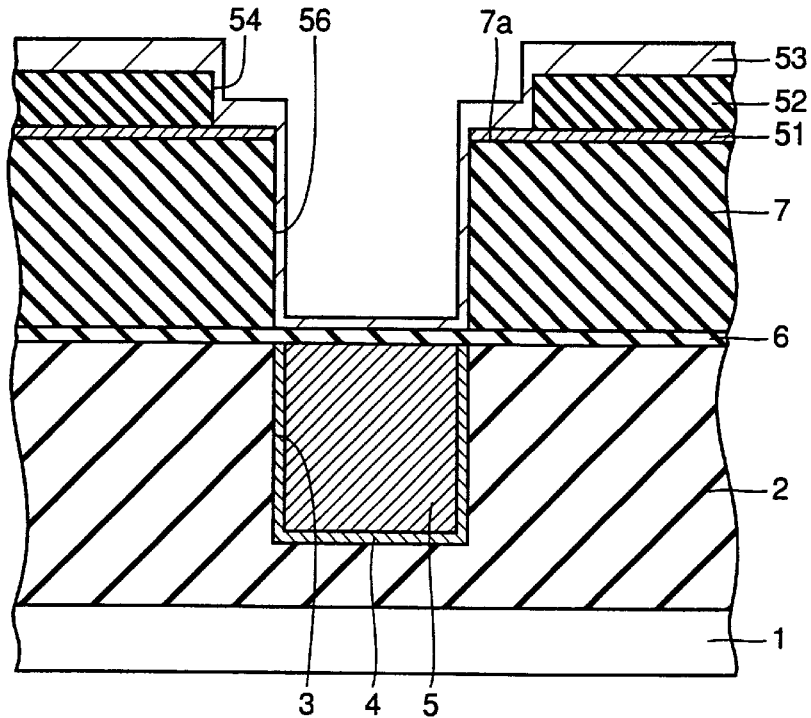

Referring to FIG. 26, a barrier layer 53 including tantalum nitride is formed by sputtering. Thicknesses of barrier layer 53 are about 20 nm, 40 nm, 60 nm and 20 nm on barrier layer 6, barrier layer 51, insulating layer 52 and side surfaces of hole 54 and through hole 56, respectively.

Figure 27:
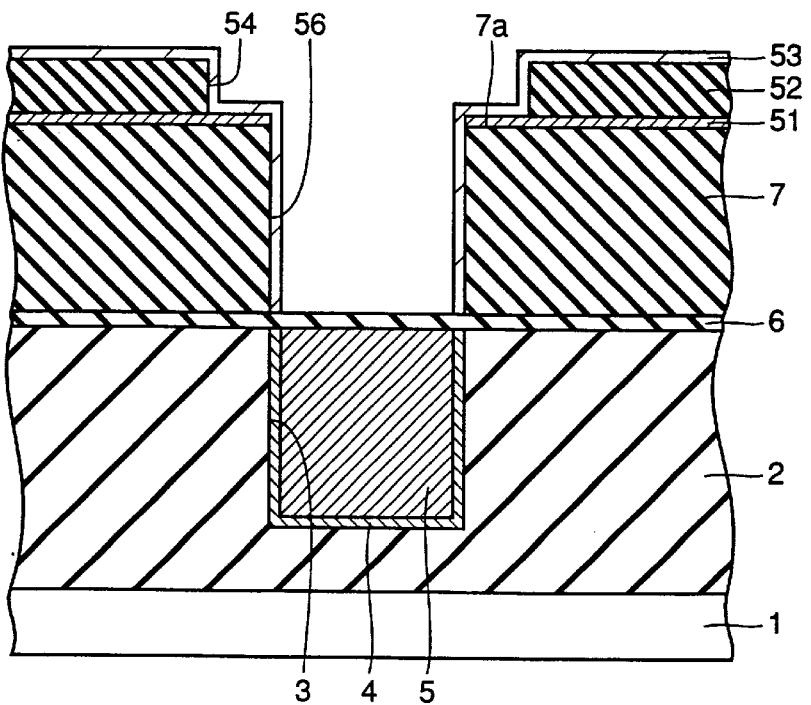

Referring to FIG. 27, an entire surface of barrier layer 53 is etched back by sputter etching using argon. Thus, barrier layer 6 is exposed, and a thickness of the other portion of barrier layer 53 would be about 20 nm.

Figure 28:
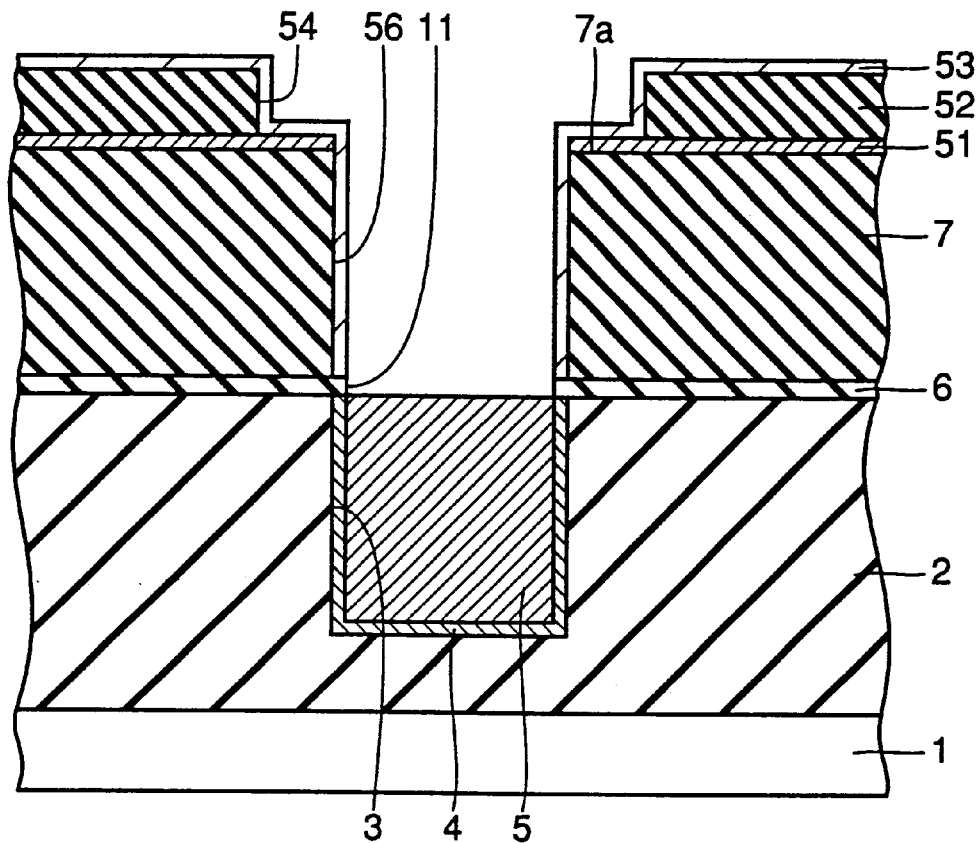
Figure 29:
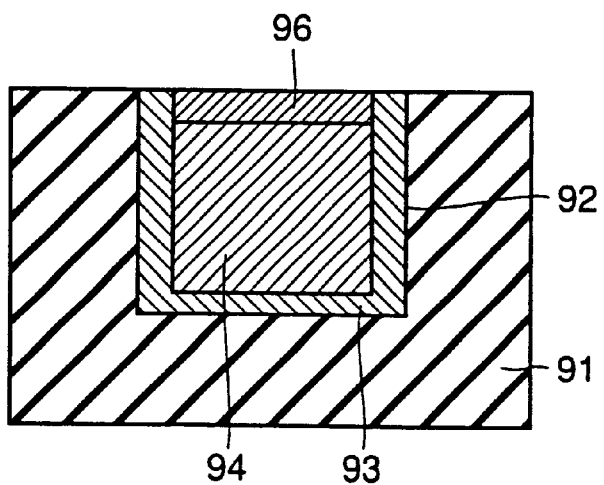
FIG. 29 is a cross sectional view showing a conductive layer in accordance with a conventional damascene structure.
Figure 30:
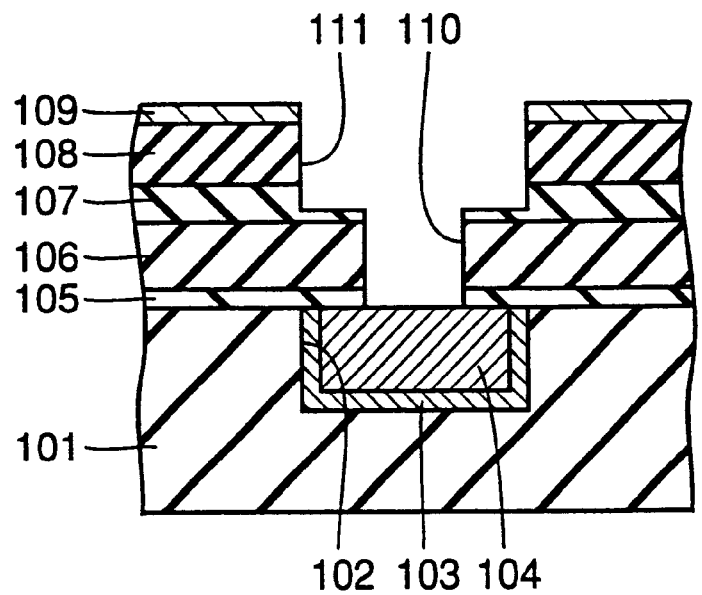
FIGS. 30 to 38 are cross sectional views showing first to ninth steps of a method of manufacturing a conventional semiconductor device having conductive layers which are mutually connected.
Figure 31:
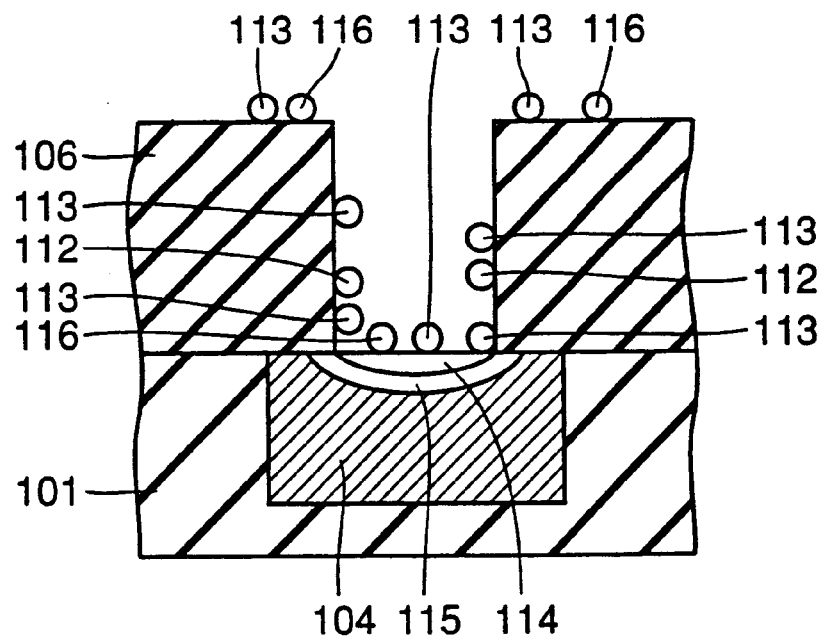
Figure 32:
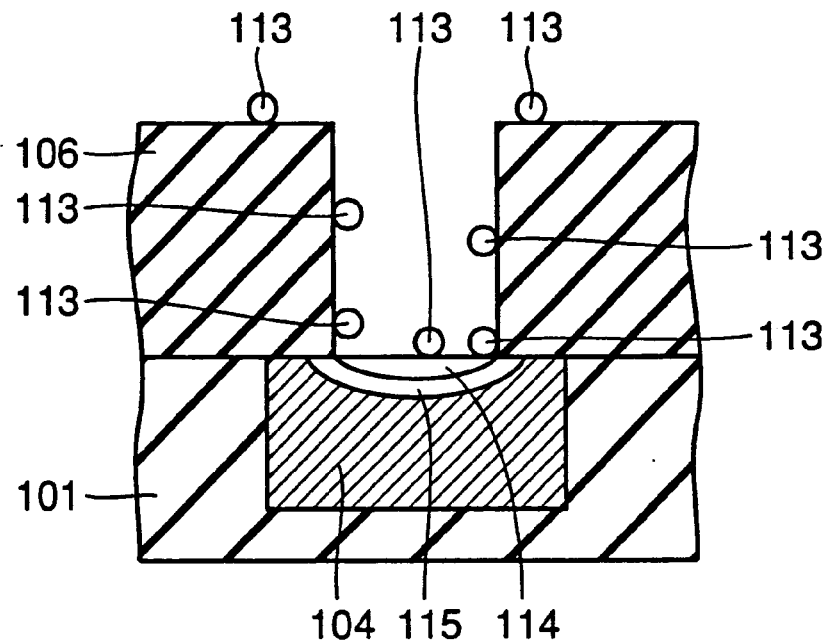
Figure 33:
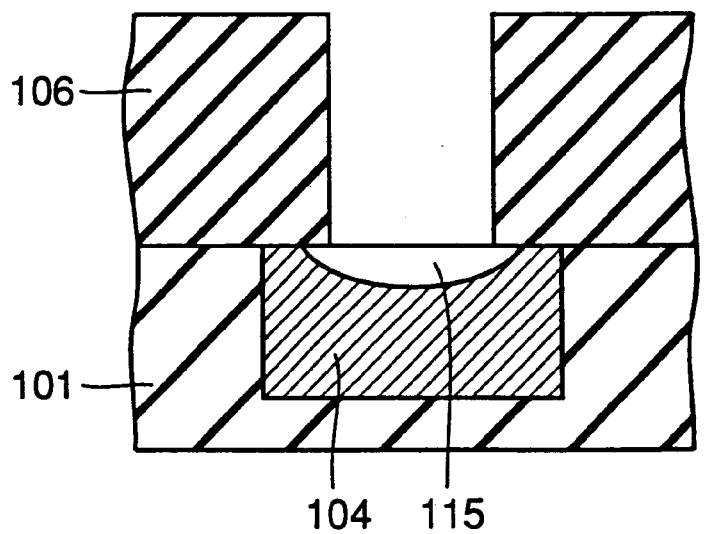
Figure 34:
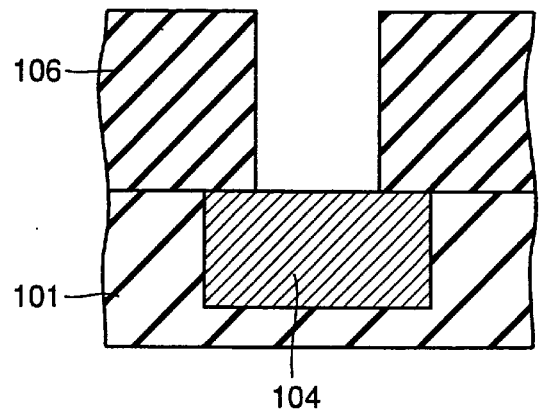
Figure 35:
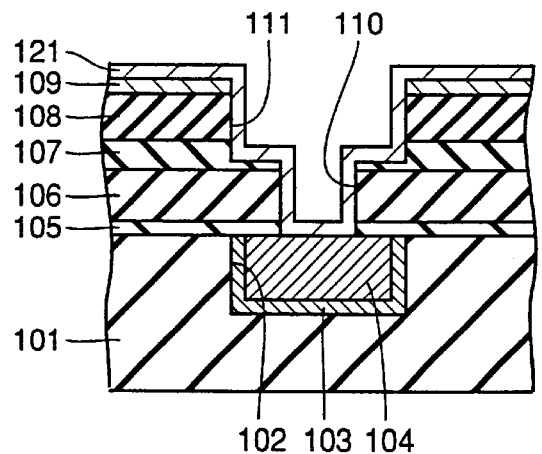
Figure 36:
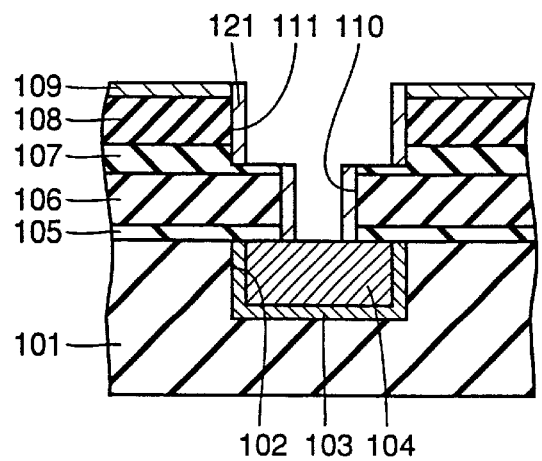
Figure 37:
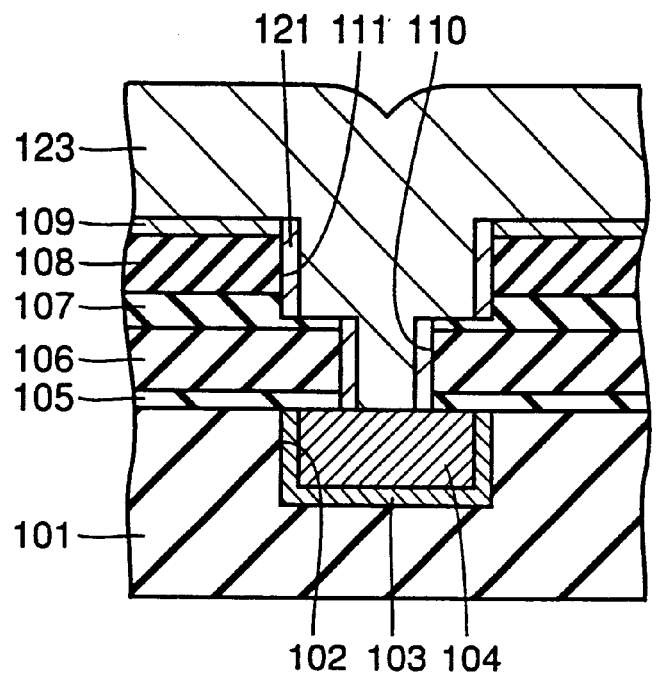
Figure 38:
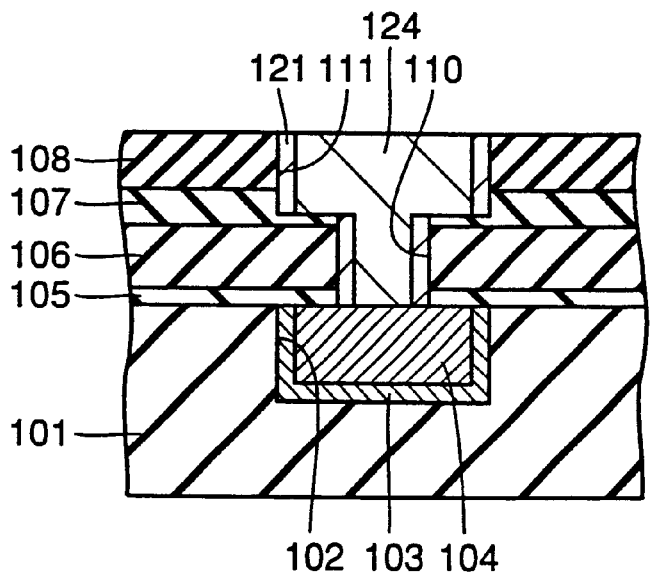

Referring to FIG. 28, barrier layer 6 is etched by CF gas. Thus, an opening 11 is formed, so that a surface of conductive layer 5 is exposed.

Referring to FIG. 23, a conductive layer 55 including copper is formed by CVD to fill through hole 56 and hole 54. Thus, the semiconductor device shown in FIG. 23 is obtained.

In the manufacturing method of the semiconductor device having the above described structure, as in the first embodiment, even if a particle of copper comes from conductive layer 5 when etching barrier layer 6 in the step shown in FIG. 28, diffusion of the particle into insulating layer 7 is prevented by barrier layer 53. Thus, conductivity of insulating layer 7 is not reduced.

Although the embodiments of the present invention have been described, various modifications can be made to be embodiments. For example, although hole 54 is formed after formation of through hole 56 in the fifth embodiment, hole 54 may first be formed, followed by through hole 56. In addition, barrier layers 4, 9, 31, 32, 41, 42 and 53 may include tantalum or titanium nitride. Further, a thickness, material or the like can suitably be changed as desired.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first insulating layer having a recess and formed on a surface of a semiconductor substrate;
   a first diffusion preventing layer formed on a surface of said recess;
   a first conductive layer formed on a surface of said first diffusion preventing layer to fill said recess;
   a second diffusion preventing layer formed on a surface of said first insulating layer and having an opening exposing a surface of said first conductive layer;
   a second insulating layer formed on a surface of said second diffusion preventing layer to expose said surface of said first conductive layer and a part of the surface of said second diffusion preventing layer and having a first hole communicating with said opening;
   a third diffusion preventing layer formed on a side surface of said first hole and on said second insulating layer in contact with an upper surface of said second diffusion preventing layer, wherein the third diffusion preventing layer is conductive; and
   a second conductive layer filling said opening and said first hole in contact with said first conductive layer, wherein the second conductive later is in direct contact with the second diffusion preventing layer.

2. The semiconductor device according to claim 1, wherein a diameter of said first hole is larger than a diameter of said opening.

3. The semiconductor device according to claim 1, wherein said first and second conductive layers include copper, and said first and second insulating layers include silicon dioxide.

4. The semiconductor device according to claim 1, wherein said first and third diffusion preventing layers include at least one material selected from a group of titanium nitride, tantalum and tantalum nitride, and said second diffusion preventing layer includes silicon nitride.

5. The semiconductor device according to claim 1, wherein the first diffusion preventing layer is formed on the entire bottom surface of the recess.

* * * * *